United States Patent
Fuchigami et al.

(10) Patent No.: US 8,310,246 B2
(45) Date of Patent: Nov. 13, 2012

(54) CONTINUITY TESTING APPARATUS AND CONTINUITY TESTING METHOD INCLUDING OPEN/SHORT DETECTION CIRCUIT

(75) Inventors: Hiroyuki Fuchigami, Kanagawa (JP); Shouichirou Satou, Kanagawa (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 439 days.

(21) Appl. No.: 12/659,342

(22) Filed: Mar. 4, 2010

(65) Prior Publication Data

US 2010/0225331 A1    Sep. 9, 2010

(30) Foreign Application Priority Data

Mar. 9, 2009 (JP) ................................ 2009-054461

(51) Int. Cl.
*H01H 31/12* (2006.01)

(52) U.S. Cl. .............. 324/551; 702/118; 324/750.3; 324/750.05; 324/537; 326/16

(58) Field of Classification Search ............... 324/551; 702/118

See application file for complete search history.

(56) References Cited

U.S. PATENT DOCUMENTS

| | | | |
|---|---|---|---|
| 4,894,605 A * | 1/1990 | Ringleb et al. | 324/537 |
| 6,194,960 B1 * | 2/2001 | Nagumo | 327/565 |
| 6,449,748 B1 | 9/2002 | Jeng et al. | |
| 6,696,849 B2 * | 2/2004 | Ban et al. | 324/750.05 |
| 2007/0198205 A1 * | 8/2007 | Shimura | 702/118 |
| 2007/0200571 A1 * | 8/2007 | Quinn et al. | 324/754 |
| 2009/0096476 A1 * | 4/2009 | Koyama | 324/763 |
| 2009/0160466 A1 * | 6/2009 | Liu | 324/754 |
| 2009/0216480 A1 * | 8/2009 | Kuo et al. | 702/118 |

* cited by examiner

*Primary Examiner* — Timothy J Dole
*Assistant Examiner* — Benjamin M Baldridge
(74) *Attorney, Agent, or Firm* — McGinn IP Law Group, PLLC

(57) ABSTRACT

A continuity testing apparatus includes open/short detection circuits provided for to-be-tested terminals, respectively and configured to determine the presence or absence of at least any one of an open-circuit failure and a short-circuit failure in to-be-tested terminals. Then, the continuity testing apparatus generates detected results of the open/short detection circuits based on the condition of continuity of the to-be-tested terminals having connections to the open/short detection circuits and the detected results from the open/short detection circuits in the preceding stages, and outputs the generated detected results to the open/short detection circuits in the succeeding stages. Further, the continuity testing apparatus determines the condition of continuity based on the output from the open/short detection circuit in the last stage.

15 Claims, 8 Drawing Sheets

FIG. 2

| DATA INPUTTED TO TO-BE-TESTED TERMINAL | | MODE | | TDI | TDO AT NORMAL CONDITION | TDO AT ABNORMAL CONDITION | CONDITION NUMBER |
|---|---|---|---|---|---|---|---|
| | | 1 | 2 | | | | |
| DURING THE NORMAL OPERATION | — | 0 | 0 | — | — | — | 1 |
| DURING THE OPEN DETECTION | ALL 0 | 1 | 0 | 0 | 1 | 0 | 2 |
| | ALL 1 | 1 | 0 | 1 | 1 | 0 | 3 |
| DURING THE SHORT DETECTION | 010101... | 0 | 1 | — | 1 | 0 | 4 |
| | 101010... | 0 | 1 | — | 1 | 0 | 5 |

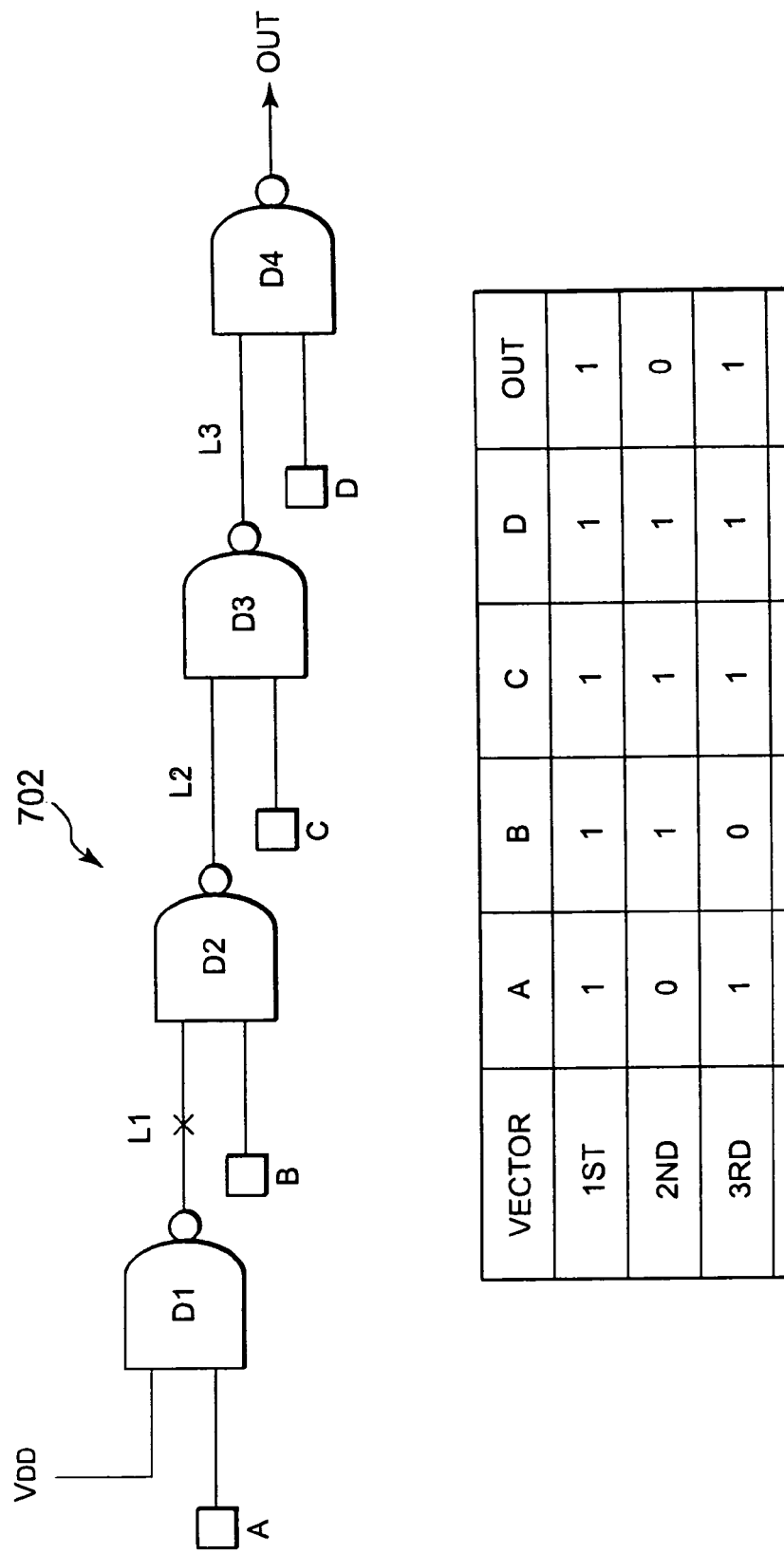

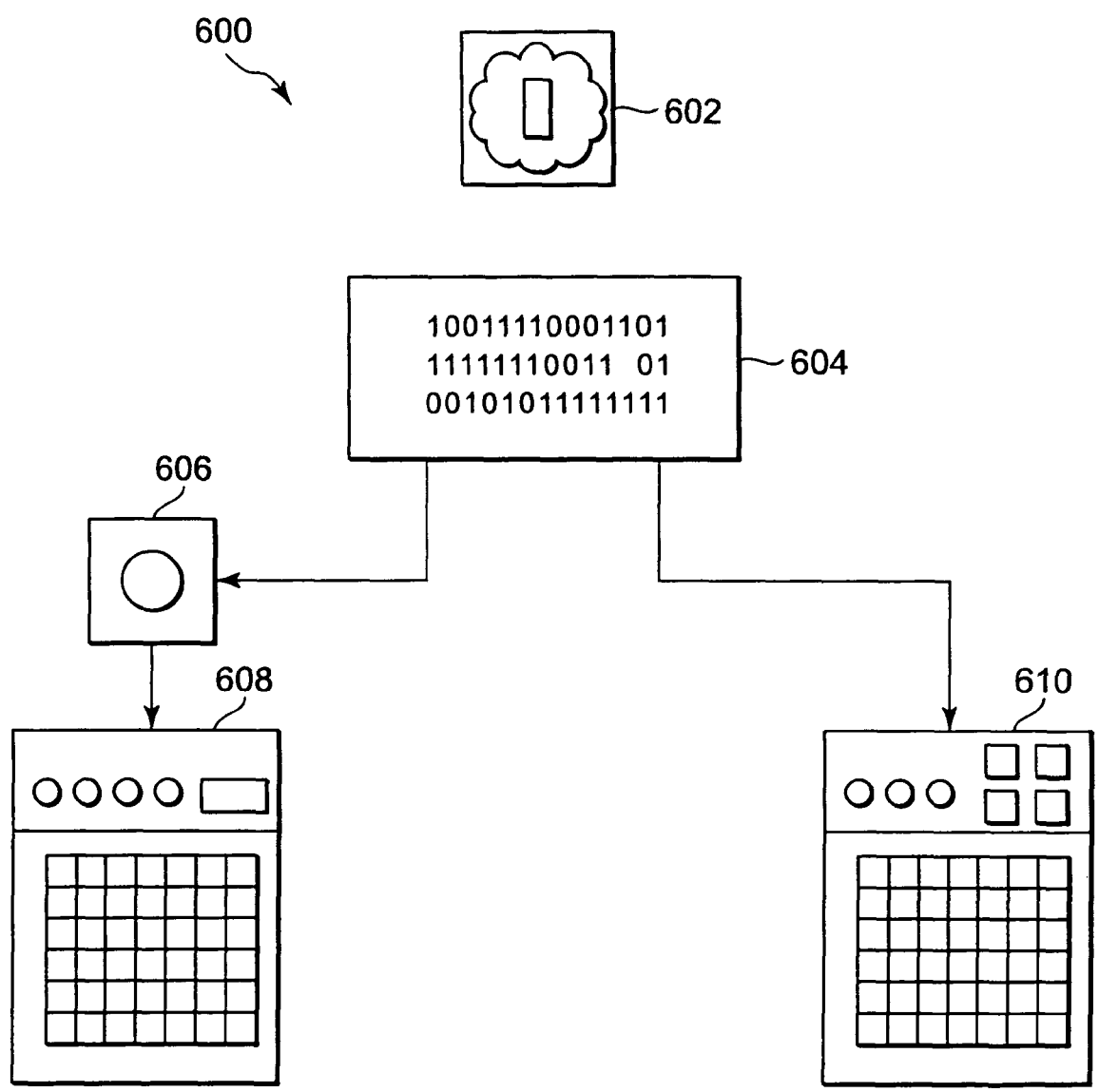

US 8,310,246 B2

CONTINUITY TESTING APPARATUS AND CONTINUITY TESTING METHOD INCLUDING OPEN/SHORT DETECTION CIRCUIT

INCORPORATION BY REFERENCE

This application is based upon and claims the benefit of priority from Japanese Patent Application No. 2009-054461 which was filed on Mar. 9, 2009, the disclosure of which is incorporated herein in its entirety by reference.

BACKGROUND OF THE INVENTION

1. Field of the Invention

The present invention relates to a continuity testing apparatus and a continuity testing method, and more particularly to a continuity testing apparatus and a continuity testing method for testing the condition of connection (or the condition of continuity) between a semiconductor device and a mounting substrate.

2. Description of Related Art

There has been known a technology in which a semiconductor device is internally provided with a circuit dedicated to connection checks, in order to check the condition of connection (or the condition of continuity) between the semiconductor device and a mounting substrate, after mounting of the semiconductor device on the mounting substrate. A NAND gate tree structure may be given as an example of the circuit dedicated to the connection checks, which is placed within the semiconductor device.

Patent document (U.S. Pat. No. 6,449,748) discloses a detection circuit including a NAND gate tree structure around a function circuit.

FIG. 6 is a diagram showing a configuration of the detection circuit according to Patent document. In FIG. 6, a NAND gate tree structure 200 is provided around a function circuit 202. Input terminals 23_0 to 23_$n$ (where n denotes a positive integer) are to-be-tested terminals, while input terminals 206 are terminals not to be tested. In the NAND gate tree structure 200, NAND circuits are connected to the input terminals 23_0 to 23_$n$ of the function circuit 202 on a one-to-one basis. One of two input signals to each of the NAND circuits is the corresponding one of the input terminals 23_0 to 23_$n$, while the other is an output signal from the NAND circuit in the preceding stage in the NAND gate tree structure 200.

An output signal 210 from each of NAND circuits 24_0 to 24_$n$ is one of two input signals to the NAND circuit in the succeeding stage in the NAND gate tree structure 200. For example, the NAND circuit 24_1 receives, as inputs, output signals from the input terminal 23_1 and from the NAND circuit 24_0, while an output signal from the NAND circuit 24_1 is an input to the NAND circuit 24_2.

The NAND gate tree structure 200 is configured so that the output signal from the NAND circuit is received by a NAND circuit in the following stage (hereinafter, sometimes called a succeeding stage). Two input signals to the NAND circuit 24_0 located in the uppermost stage in a tree are the input terminal 23_0 and a power supply voltage VDD. Then, the detection circuit according to Patent document determines the condition of continuity, based on a voltage level of an output terminal 220 of the NAND circuit 24_$n$ located in the lowermost stage in the tree.

FIG. 7 is a diagram showing the operation of the detection circuit according to Patent document, and a truth table showing a circuit operation. A NAND gate tree structure 702 includes NAND circuits D1 to D4 connected to each other through paths L1 to L3, and input terminals A to D. Inputs to the NAND circuit D1 are the input terminal A and the power supply voltage VDD. Inputs to the NAND circuit D2 are the input terminal B, and an output signal which propagates from the NAND circuit D1 through the path L1. Inputs to the NAND circuit D3 are the input terminal C, and an output signal which propagates from the NAND circuit D2 through the path L2. Inputs to the NAND circuit D4 are the input terminal D, and an output signal which propagates from the NAND circuit D3 through the path L3 and comes in.

Vectors in a truth table 704 showing the circuit operation of the NAND gate tree structure 702 shown in FIG. 7 are each formed of a pattern containing four input signals and one output signal. Description will be given for a method for detecting a break in the path L1, for example, of the NAND gate tree structure 702.

With the path L1 broken, an output from the NAND circuit D1 does not propagate into the NAND circuit D2 under any one of Vectors' 1st and 2nd conditions in the truth table 704. Thus, the NAND circuit D2 does not output a normal value, so that an output terminal OUT does not output an expected value. Under a Vector's 3rd condition, an input at the input terminal B is a "Lo (0)" level, and an output from the NAND circuit D3 is a "Hi (1)" level independently of an output from the NAND circuit D2. Consequently, the output terminal OUT outputs an expected value (because, with NAND logic, an output is always a "Hi (1)" level whenever the terminal B is at a "Lo (0)" level).

Under Vectors' 4th and 5th conditions, likewise, the output terminal OUT outputs their respective expected values. The break in the path L1 is detectable, based on the fact that abnormal conditions are encountered under the Vectors' 1st and 2nd conditions, whereas normal conditions are encountered under the Vectors' 3rd, 4th and 5th conditions.

FIG. 8 is a diagram showing a mounting evaluation environment according to Patent document. A test system 600 includes a function circuit 602 including the NAND gate tree structure 200 connected to the input terminals, shown in FIG. 6. The test system 600 includes a computer 604 that controls input of the patterns to the input terminals (or controls a pattern generator circuit), a pattern input/output interface 606, an evaluation substrate 608, and a test instrument 610 for testing a chip.

SUMMARY

According to Patent document, a continuity check after mounting involves providing the NAND gate tree structure 200 around the function circuit 202, inputting the patterns to the to-be-tested terminals, monitoring an output from the NAND circuit located in the last stage in the NAND gate tree structure 200, and thereby determining whether the condition of continuity is normal or abnormal. An evaluation environment requires monitoring of an evaluation substrate dedicated to mounting evaluation, a test vector (or pattern) generator circuit, and a test vector (or pattern) input/output terminal.

However, defective conditions undetectable with the NAND logic shown in the truth table showing the circuit operation exist in the detection circuit according to Patent document. The defective conditions undetectable with the NAND logic include a short-circuit failure between adjacent terminals, and an open-circuit failure fixed to a "Hi (1)" level in an even-numbered terminal.

Using FIG. 7, description will be given for the reason why the short-circuit failure between the adjacent terminals and the open-circuit failure fixed to a "Hi (1)" level in the even-numbered terminal are undetectable. As can be seen from FIG. 7, a condition for performing a connection check on the input terminal B is the Vector's 3rd condition in the truth table. When a "Lo (0)" level is inputted to the input terminal B while a "Hi (1)" level is inputted to the other input terminal, the output terminal OUT provides output of a "Hi (1)" level if the condition of connection of the input terminal B is normal.

However, if a short circuit occurs between the input terminal B and the input terminal A or between the input terminal B and the input terminal C, then the voltage level of the input terminal B may possibly get drawn into a "Hi (1)" level on the short-circuited input terminal (namely, any one of the input terminal A and the input terminal B). This situation leads to the same condition as the Vector's 1st condition, so that the output terminal OUT provides output of a "Hi (1)" level as the normal value.

As can be seen from FIG. 7, the even-numbered terminals are the input terminal B and the input terminal D. If the input terminal B is fixed to a "Hi (1)" level at the occurrence of an open-circuit failure, then this leads to the same condition as the Vector's 1st condition. Consequently, the output terminal OUT provides output of a "Hi (1)" level indicative of a normal condition.

Therefore, the short-circuit failure between the adjacent terminals and the open-circuit failure fixed to a "Hi (1)" level in the even-numbered terminal are undetectable with the detection circuit according to Patent document.

A continuity testing apparatus, according to an exemplary aspect of the present invention, for testing the condition of continuity between a semiconductor device and a mounting substrate on which the semiconductor device is mounted includes an open/short detection circuit provided for each of to-be-tested terminals, and configured to determine the presence or absence of at least any one of an open-circuit failure and a short-circuit failure in the to-be-tested terminal. In the apparatus, a detected result of the open/short detection circuit is generated based on the condition of continuity of the to-be-tested terminal connected to the open/short detection circuit and a detected result from the open/short detection circuit in a preceding stage, and the generated detected result is outputted to the open/short detection circuit in a succeeding stage, and the condition of continuity is determined based on an output from the open/short detection circuit in the last stage.

The continuity testing apparatus according to the present invention detects the presence or absence of an open circuit or a short circuit for each of the to-be-tested terminals, thus enabling detection of a short-circuit failure between adjacent terminals and an open-circuit failure fixed to a Hi level in an even-numbered terminal.

A continuity testing method, according to an exemplary aspect of the present invention, for testing a condition of continuity between a semiconductor device and a mounting substrate on which the semiconductor device is mounted uses an open/short detection circuit provided for each of to-be-tested terminals and configured to determine the presence or absence of at least any one of an open-circuit failure and a short-circuit failure in the to-be-tested terminal. The method includes: generating a detected result of the open/short detection circuit based on a condition of continuity of the to-be-tested terminal connected to the open/short detection circuit and a detected result from the open/short detection circuit in a preceding stage, and outputting the generated detected result to the open/short detection circuit in a succeeding stage; and determining the condition of continuity based on an output from the open/short detection circuit in the last stage.

The continuity testing method according to the present invention detects the presence or absence of an open circuit or a short circuit for each of the to-be-tested terminals, thus enabling detection of a short-circuit failure between adjacent terminals and an open-circuit failure fixed to a Hi level in an even-numbered terminal.

The exemplary aspects of the present invention can provide the continuity testing apparatus and the continuity testing method capable of detecting a short-circuit failure between adjacent terminals and an open-circuit failure fixed to a Hi level in an even-numbered terminal.

BRIEF DESCRIPTION OF THE DRAWINGS

The above and other exemplary aspects, advantages and features of the present invention will be more apparent from the following description of certain exemplary embodiments taken in conjunction with the accompanying drawings, in which:

FIG. 2 is a truth table useful in explaining operation of the continuity testing apparatus according to the exemplary embodiment;

FIG. 7 is a diagram and a truth table showing circuit operation of the detector circuit according to the related art; and FIG. 8 is a diagram showing a mounting evaluation environment for the detector circuit according to the related art.

DETAILED DESCRIPTION OF THE EXEMPLARY EMBODIMENTS

Figure 1:
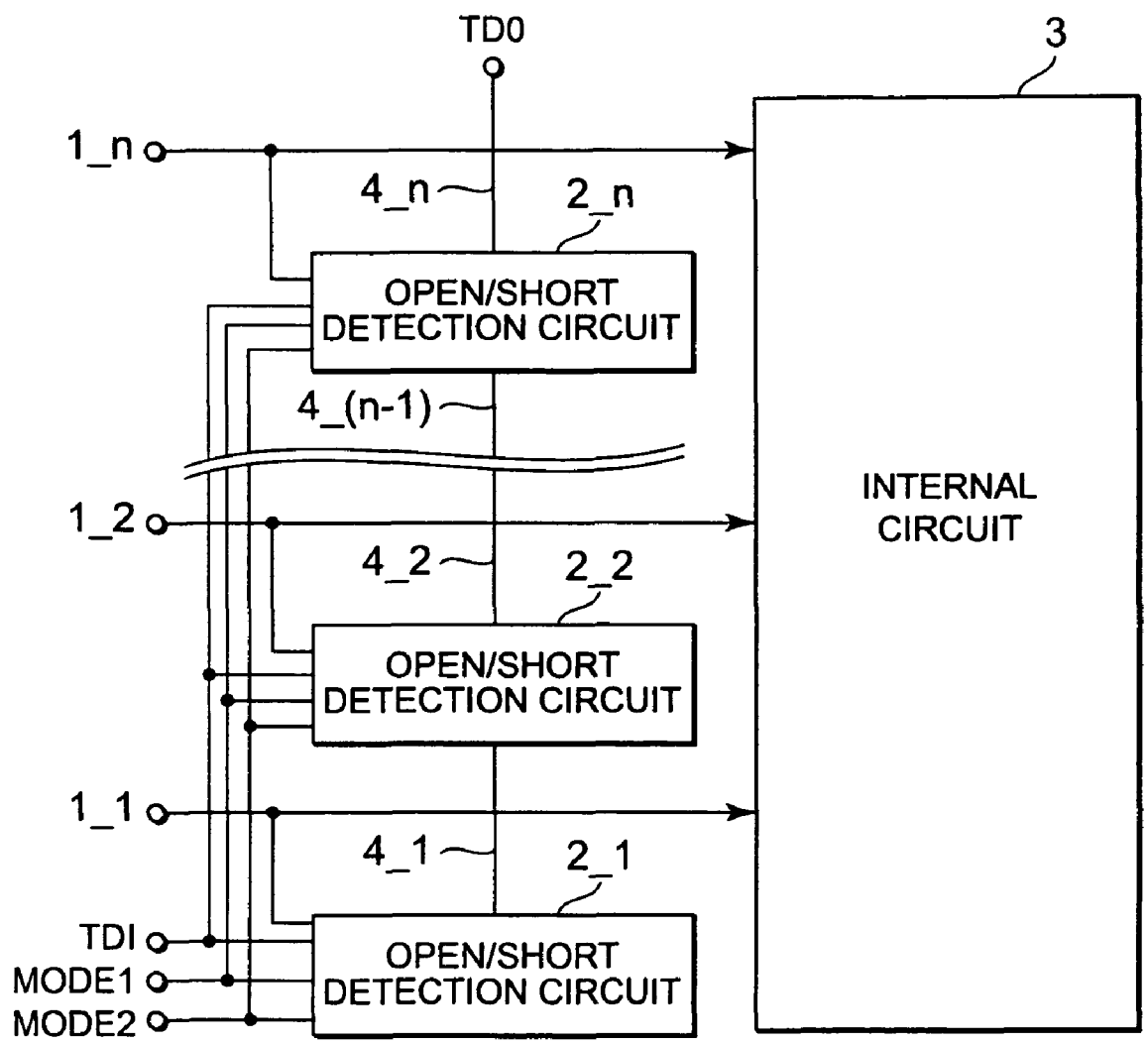
FIG. 1 is a diagram showing a continuity testing apparatus according to an exemplary embodiment.

FIG. 1 shows a continuity testing apparatus according to an exemplary embodiment. FIG. 2 shows a truth table showing operation of the continuity testing apparatus according to the exemplary embodiment. The continuity testing apparatus includes open/short detection circuits $2\_1$ to $2\_n$ for to-be-tested terminals, respectively, thereby to check the condition of terminal connection, thus enabling detection of an open-circuit failure and a short-circuit failure between adjacent terminals.

Specifically, the continuity testing apparatus includes the plural open/short detection circuits $2\_1$ to $2\_n$ that determine the presence or absence of at least any one of an open-circuit failure and a short-circuit failure in the to-be-tested terminals, the open/short detection circuits $2\_1$ to $2\_n$ being provided for to-be-tested terminals $1\_1$ to $1\_n$, respectively (which are each the same as an input/output terminal of an internal circuit 3). Then, the continuity testing apparatus generates detected results $4\_1$ to $4\_n$ of the corresponding open/short detection circuits, based on a condition of continuity of each of the to-be-tested terminals which the open/short detection circuits are connected to, and detected results $4\_1$ to $4\_(n-1)$ obtained by the open/short detection circuits in the preceding stages, and outputs the detected results $4\_1$ to $4\_n$ to the open/short detection circuits in the succeeding stages. Further, the continuity testing apparatus determines the condition of continuity, based on the output 4_*n* from the open/short detection circuit in the last stage.

If any one of an open-circuit failure and a short-circuit failure occurs in the condition of continuity of each of the to-be-tested terminals connected to the open/short detection circuit, then each of the open/short detection circuits outputs a detected result indicating that the to-be-tested terminal has any one of the open-circuit failure and the short-circuit failure, to the open/short detection circuit in the succeeding stage.

Meanwhile, if the condition of continuity of the to-be-tested terminal connected to the open/short detection circuit is normal, then each of the open/short detection circuits outputs an output result from the open/short detection circuit in the preceding stage, to the open/short detection circuit in the succeeding stage. In other words, if the open/short detection circuit in the preceding stage detects any one of an open-circuit failure and a short-circuit failure, then this detected result is passed to the open/short detection circuit in the succeeding stage.

The open/short detection circuits 2_1 to 2_*n* each include four input terminals, namely, a corresponding one of the to-be-tested terminals 1_1 to 1_*n*, a TDI terminal, a MODE-1 terminal (or a first mode terminal), and a MODE-2 terminal (or a second mode terminal). The output signals 4_1 to 4_(*n*−1) from the open/short detection circuits 2_1 to 2_(*n*−1) are input signals to the open/short detection circuits 2_2 to 2_*n* in the following stages, respectively. The output signal 4_*n* from the open/short detection circuit 2_*n* (or the open/short detection circuit in the last stage) is outputted from a TDO terminal.

Using the continuity testing apparatus shown in FIG. 1 and the truth table shown in FIG. 2, description will now be given for the operation of the continuity testing apparatus according to the exemplary embodiment. A check of the condition of terminal connection (or in the case of continuity) after mounting is accomplished by operating the open/short detection circuits 2_1 to 2_*n* arranged in the continuity testing apparatus.

The MODE-1 terminal and the MODE-2 terminal are the terminals that enable operation of each of the open/short detection circuits 2_1 to 2_*n*. To enable an open detection function, the MODE-1 terminal is set to a "Hi (1)" level, while to enable a short detection function, the MODE-2 terminal is set to a "Hi (1)" level.

To disable the operation of each of the open/short detection circuits 2_1 to 2_*n* in order for a device to perform normal operation, both the MODE-1 terminal and the MODE-2 terminal are set to a "Lo (0)" level. Simultaneous input of a "Hi (1)" level to the MODE-1 terminal and the MODE-2 terminal is inhibited. The MODE-1 terminal and the MODE-2 terminal are signals required for selection between enable mode and disable mode of the open detection function and the short detection function, and are set from outside the continuity testing apparatus.

The to-be-tested terminals 1_1 to 1_*n* are the terminals for the continuity testing apparatus to perform a check of connection to a mounting substrate, and include an input terminal, an output terminal and an input/output terminal of the continuity testing apparatus. The TDI terminal is an input terminal, and receives a signal of the same level as the to-be-tested terminal during open detection operation. For example, when a "Hi (1)" level is inputted to all of the to-be-tested terminals 1_1 to 1_*n*, a "Hi (1)" level likewise is inputted to the TDI terminal. When a "Lo (0)" level is inputted to all of the to-be-tested terminals 1_1 to 1_*n*, a "Lo (0)" level likewise is inputted to the TDI terminal.

The TDO terminals are the terminals that provide output of results of connection checks of the to-be-tested terminals 1_1 to 1_*n*. If any one of an open-circuit failure and a short-circuit failure between adjacent terminals exists in each of the to-be-tested terminals 1_1 to 1_*n*, then a value different from an expected value is outputted. As can be seen from the truth table, if the condition of connection of each of the to-be-tested terminals 1_1 to 1_*n* is normal, then the TDO terminal provides output of a "Hi (1)" level. If any one of an open-circuit failure and a short-circuit failure between adjacent terminals exists in each of the to-be-tested terminals 1_1 to 1_*n*, then the TDO terminal provides output of a "Lo (0)" level.

Using the truth table (or condition numbers 1 to 5) shown in FIG. 2, description will now be given for the operation of the continuity testing apparatus shown in FIG. 1. Typical device operation (or in the case number 1) can be accomplished by inputting a "Lo (0)" level to the MODE-1 terminal and the MODE-2 terminal and thereby disabling the operation of each of the open/short detection circuits 2_1 to 2_*n*. The open detection operation (or in the case numbers 2 and 3) can be accomplished by inputting a "Hi (1)" level to the MODE-1 terminal, and inputting a "Lo (0)" level to the MODE-2 terminal. Short detection operation (or in the case numbers 4 and 5) can be accomplished by inputting a "Lo (0)" level to the MODE-1 terminal, and inputting a "Hi (1)" level to the MODE-2 terminal.

Under the condition number 2 in the truth table shown in FIG. 2, a "Lo (0)" level can be inputted to all the to-be-tested terminals 1_1 to 1_*n* and the TDI terminals thereby to detect an open-circuit failure fixed to a "Hi (1)" level in the to-be-tested terminals 1_1 to 1_*n*. For example, if the condition of connection of the to-be-tested terminal 1_1 is normal, then the output signal 4_1 from the open/short detection circuit 2_1 connected to the to-be-tested terminal 1_1 becomes a "Hi (1)" level. Then, the output signal 4_1 becomes an input signal to the open/short detection circuit 2_2 connected to the to-be-tested terminal 1_2.

Further, if the condition of connection of the to-be-tested terminal 1_2 is normal, then the output signal 4_2 from the open/short detection circuit 2_2 connected to the to-be-tested terminal 1_2 likewise becomes a "Hi (1)" level, and becomes an input signal to the open/short detection circuit in the following stage. Then, a "Hi (1)" level is outputted from the TDO terminal as the output terminal of the open/short detection circuit 2_*n* connected to the to-be-tested terminal 1_*n* in the last stage. Thereby, a determination is made that the condition of connection of all the to-be-tested terminals 1_1 to 1_*n* is normal.

However, if an open-circuit failure fixed to a "Hi (1)" level exists in the to-be-tested terminals 1_1 to 1_*n*, then the open/short detection circuit outputs a "Lo (0)" level, and all outputs from the open/short detection circuits in the following stage and thereafter become a "Lo (0)" level. Then, the TDO terminals likewise provide output of a "Lo (0)" level, so that the open-circuit failure fixed to a "Hi (1)" level can be detected.

Under the condition number 3 in the truth table shown in FIG. 2, a "Hi (1)" level can be inputted to all the to-be-tested terminals 1_1 to 1_*n* and the TDI terminals thereby to detect an open-circuit failure fixed to a "Lo (0)" level in the to-be-tested terminals 1_1 to 1_*n*. For example, if the condition of connection of the to-be-tested terminal 1_1 is normal, then the output signal 4_1 from the open/short detection circuit 2_1 connected to the to-be-tested terminal 1_1 becomes a "Hi (1)" level. Then, the output signal 4_1 becomes an input signal to the open/short detection circuits 2_2 connected to the to-be-tested terminal 1_2.

Further, if the condition of connection of the to-be-tested terminal 1_2 is normal, then the output signal 4_2 from the open/short detection circuit 2_2 connected to the to-be-tested terminal 1_2 likewise becomes a "Hi (1)" level, and becomes an input signal to the open/short detection circuit in the following stage. Then, a "Hi (1)" level is outputted from the TDO terminal as the output terminal of the open/short detection circuit 2_n connected to the to-be-tested terminal 1_n in the last stage. Thereby, a determination is made that the condition of connection of all the to-be-tested terminals 1_1 to 1_n is normal.

However, if an open-circuit failure fixed to a "Lo (0)" level exists in the to-be-tested terminals 1_1 to 1_n, then, the open/short detection circuit outputs a "Lo (0)" level, and all outputs from the open/short detection circuits in the following stage and thereafter become a "Lo (0)" level. Then, the TDO terminals likewise provide output of a "Lo (0)" level, so that the open-circuit failure fixed to a "Lo (0)" level can be detected.

Under the condition number 4 in the truth table shown in FIG. 2, a "Lo (0)" level is inputted to odd-numbered terminals of the to-be-tested terminals 1_1 to 1_n, and a "Hi (1)" level is inputted to even-numbered terminals, whereby a short-circuit failure between adjacent terminals can be detected. If the condition of connection of the to-be-tested terminal 1_1 is normal, then, the output signal 4_1 from the open/short detection circuit 2_1 connected to the to-be-tested terminal 1_1 becomes a "Hi (1)" level. Then, the output signal 4_1 becomes an input signal to the open/short detection circuits 2_2 connected to the to-be-tested terminal 1_2.

Further, if the condition of connection of the to-be-tested terminal 1_2 is normal, then the output signal 4_2 from the open/short detection circuit 2_2 connected to the to-be-tested terminal 1_2 likewise becomes a "Hi (1)" level, and becomes an input signal to the open/short detection circuit in the following stage. Then, a "Hi (1)" level is outputted from the TDO terminal as the output terminal of the open/short detection circuit 2_n connected to the to-be-tested terminal 1_n in the last stage. Thereby, a determination is made that the condition of connection of all the to-be-tested terminals 1_1 to 1_n is normal.

However, if a short-circuit failure between adjacent terminals exists in the to-be-tested terminals 1_1 to 1_n, then, the open/short detection circuit connected to the short-circuited terminal outputs a "Lo (0)" level. Then, all outputs from the open/short detection circuits in the following stage and thereafter become a "Lo (0)" level. The TDO terminals likewise provide output of a "Lo (0)" level, so that the short-circuit failure between adjacent terminals can be detected.

Under the condition number 5 in the truth table shown in FIG. 2, a "Hi (1)" level is inputted to the odd-numbered terminals of the to-be-tested terminals 1_1 to 1_n, and a "Lo (0)" level is inputted to the even-numbered terminals, whereby a short-circuit failure between adjacent terminals can be detected, as in the case of the condition number 4. As mentioned above, if the condition of connection to the mounting substrate is not abnormal, then, the TDO terminal provides output of a "Hi (1)" level, so that a determination is made that the condition is normal. If any one of an open-circuit failure and a short-circuit failure between adjacent terminals exists, then, the TDO terminal provides output of a "Lo (0)" level, so that a determination is made that the condition is abnormal.

Figure 3:
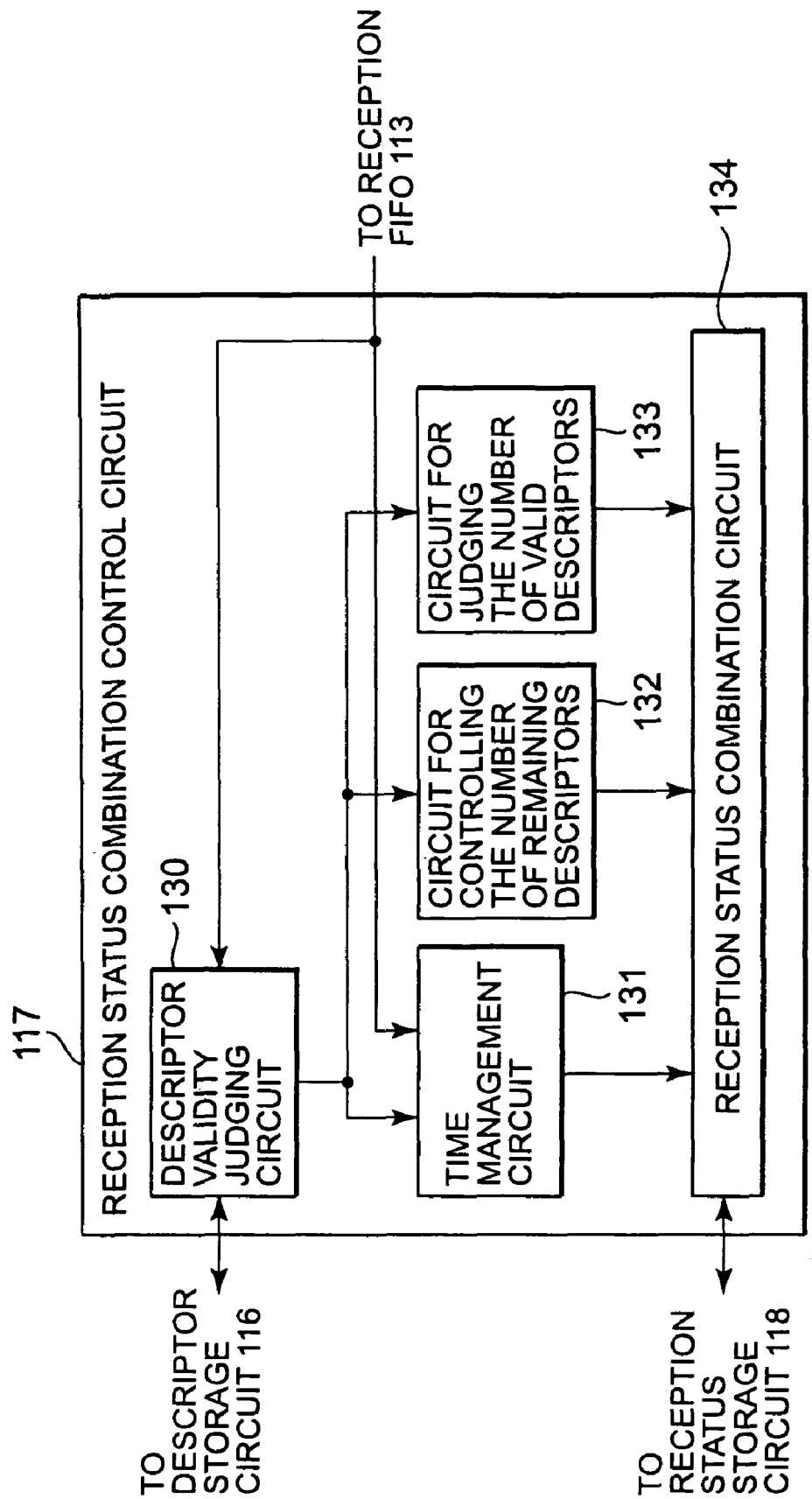
FIG. 3 is a diagram showing an example of circuits that form the continuity testing apparatus according to the exemplary embodiment.
Figure 4:
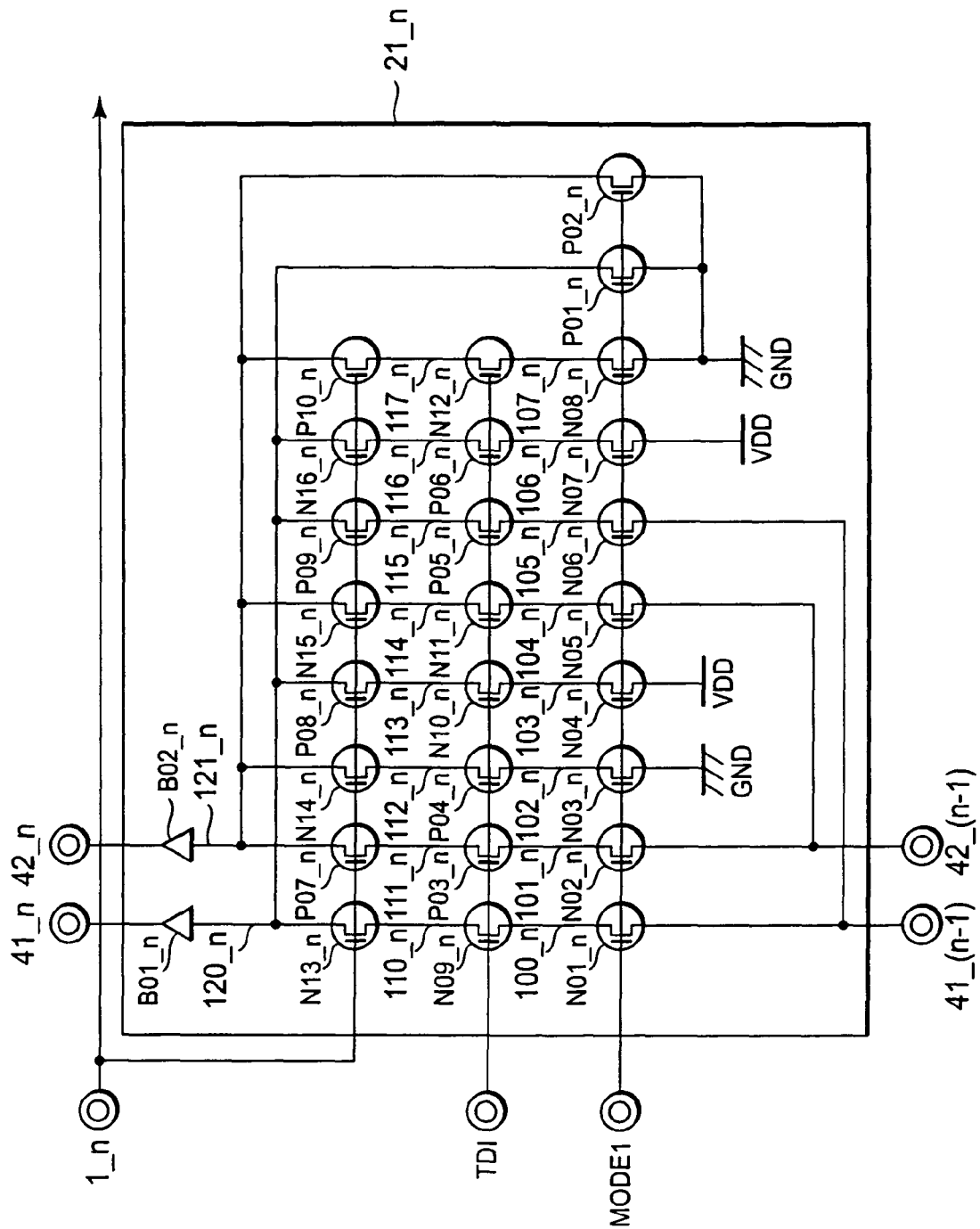
FIG. 4 is a diagram showing an example of an open detector circuit that forms the continuity testing apparatus according to the exemplary embodiment.
Figure 5:
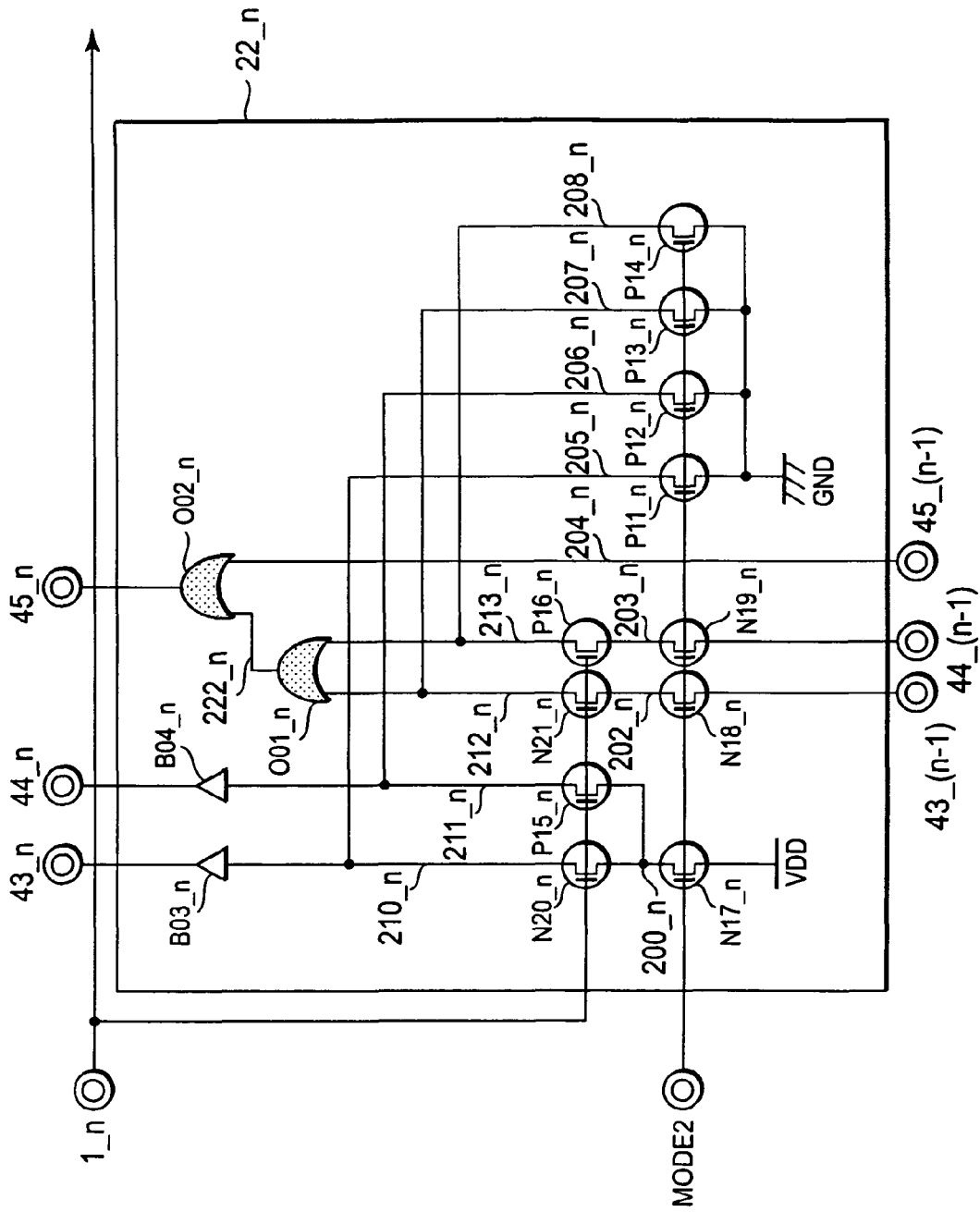
FIG. 5 is a diagram showing an example of a short detector circuit that forms the continuity testing apparatus according to the exemplary embodiment.
Figure 6:
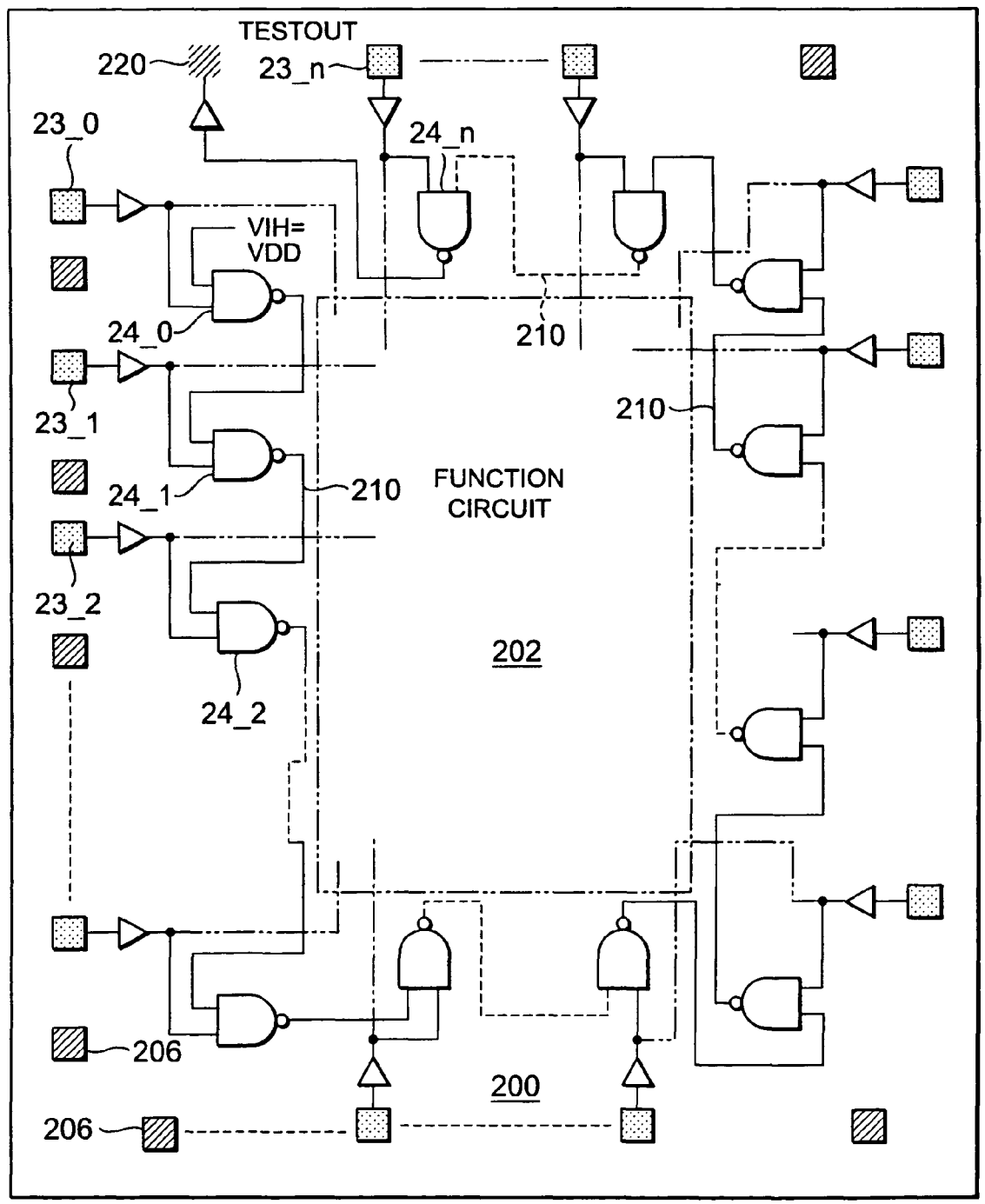
FIG. 6 is a diagram showing a detector circuit according to a related art.

FIG. 3 shows an example of the continuity testing apparatus according to the exemplary embodiment. FIGS. 4 and 5 show an example of an open detection circuit and an example of a short detection circuit, respectively, of the continuity testing apparatus according to the exemplary embodiment. Firstly, the continuity testing apparatus shown in FIG. 3 will be described.

The continuity testing apparatus shown in FIG. 3 includes the to-be-tested terminals 1_1 to 1_n, open detection circuits 21_1 to 21_n that detect an open-circuit failure in the to-be-tested terminals 1_1 to 1_n, and short detection circuits 22_1 to 22_n that detect a short-circuit failure between adjacent terminals in the to-be-tested terminals 1_1 to 1_n. Further, the continuity testing apparatus includes a TDI terminal that receives input of a signal of the same level as the to-be-tested terminals 1_1 to 1_n during open detection, a MODE-1 terminal and a MODE-2 terminal that receive input of a select signal for the typical device operation, the open detection operation and the short detection operation, and a TDO terminal that provides output of results of connection checks.

Output signals 41_1 and 42_1 from the open detection circuit 21_1 are input signals to the open detection circuit 21_2, and output signals 41_(n−1) and 42_(n−1) from the open detection circuit 21_(n−1) are input signals to the open detection circuit 21_n. Here, (n−1) denotes the next preceding stage.

Output signals 43_1, 44_1, and 45_1 from the short detection circuit 22_1 are input signals to the short detection circuit 22_2. Output signals 43_(n−1), 44_(n−1) and 45_(n−1) from the short detection circuit 22_(n−1) are input signals to the short detection circuit 22_n.

An output 41_n from the open detection circuit 21_n in the lowermost stage is a drain input signal to an N channel transistor 31 controlled by the MODE-1 terminal. A source output signal 51 from the N channel transistor 31 is an input signal to an inverter 33. Then, an output signal from the inverter 33 is outputted to the outside from the TDO terminal.

Another output signal 42_n from the open detection circuit 21_n is a drain input signal to an N channel transistor 32 controlled by the MODE-1 terminal. Then, a source output signal 53 (which is the same in level as the output from the inverter 33) from the N channel transistor 32 is outputted to the outside from the TDO terminal.

Meanwhile, an output 45_n from the short detection circuit 22_n in the lowermost stage is a drain input signal to an N channel transistor 34 controlled by the MODE-2 terminal. A source output signal 52 from the N channel transistor 34 is an input signal to an inverter 35. Then, an output signal from the inverter 35 is outputted to the outside from the TDO terminal. The remaining two outputs 43_n and 44_n from the short detection circuit 22_n is not outputted because of being undesired signals.

Description will now be given for an example of configuration of the open detection circuit shown in FIG. 4. The open detection circuit 21_n shown in FIG. 4 includes the to-be-tested terminal 1_n, the TDI terminal, the MODE-1 terminal, and the input terminals 41_(n−1) and 42_(n−1), as the input terminals, and includes the output terminals 41_n and 42_n−1 as the output terminals. An output signal from the output terminal 41_n is the input signal 41_n to the open detection circuit 21_(n+1) in the following stage. An output signal from the output terminal 42_n is the input signal 42_n to the open detection circuit 21_(n+1) in the following stage.

The open detection circuit 21_n includes N channel transistors N01_n to N16_n (hereinafter called merely N01_n to N16_n), P channel transistors P01_n to P10_n (hereinafter called merely P01_n to P10_n), and buffers B01_n and B02_$n$ that suppress variations in voltage level. The MODE-1 terminal is connected to gates of N01_$n$ to N08_$n$ and P01_$n$ to P02_$n$. The TDI terminal is inputted to gates of N09_$n$ to N12_$n$ and P03_$n$ to P06_$n$. The to-be-tested terminal 1_$n$ is inputted to gates of N13_$n$ to N16_$n$ and P07_$n$ to P10_$n$.

The input terminal 41_($n$−1) is connected to a drain of N01_$n$, and a source output signal 100_$n$ from N01_$n$ is a drain input signal to N09_$n$. A source output signal 110_$n$ from N09_$n$ is a drain input signal to N13_$n$, and a source output signal 120_$n$ from N13_$n$ is an input signal to B01_$n$. Then, an output signal from B01_$n$ is outputted from the output terminal 41_$n$. Further, the input terminal 41_($n$−1) is connected to a drain of N06_$n$, and a source output signal 105_$n$ from N06_$n$ is a source input signal to P05_$n$. A drain output signal 115_$n$ from P05_$n$ is a source input signal to P09_$n$, and a drain output signal 120_$n$ from P09_$n$ is an input signal to B01_$n$.

The input terminal 42_($n$−1) is connected to a drain of N02_$n$, and a source output signal 101_$n$ from N02_$n$ is a source input signal to P03_$n$. A drain output signal 111_$n$ from P03_$n$ is a source input signal to P07_$n$, and a drain output signal 121_$n$ from P07_$n$ is an input signal to B02_$n$. Then, an output signal from B02_$n$ is outputted from the output terminal 42_$n$. Further, the input terminal 42_($n$−1) is connected to a drain of N05_$n$, and a source output signal 104_$n$ from N05_$n$ is a drain input signal to N11_$n$. A source output signal 114_$n$ from N11_$n$ is a drain input signal to N15_$n$, and a source output signal 121_$n$ from N15_$n$ is an input signal to B02_$n$.

A power supply voltage VDD is connected to a drain of N04_$n$, and a source output signal 103_$n$ from N04_$n$ is a drain input signal to N10_$n$. A source output signal 113_$n$ from N10_$n$ is a source input signal to P08_$n$, and a drain output signal 120_$n$ from P08_$n$ is an input signal to B01_$n$. Further, the power supply voltage VDD is connected to a drain of N07_$n$, and a source output signal 106_$n$ from N07_$n$ is a source input signal to P06_$n$. A drain output signal 116_$n$ from P06_$n$ is a drain input signal to N16_$n$, and a source output signal 120_$n$ from N16_$n$ is an input signal to B01_$n$.

A ground GND is connected to a drain of N03_$n$, and a source output signal 102_$n$ from N03_$n$ is a source input signal to P04_$n$. A drain output signal 112_$n$ from P04_$n$ is a drain input signal to N14_$n$, and a source output signal 121_$n$ from N14_$n$ is an input signal to B02_$n$. Further, the ground GND is connected to a drain of N08_$n$, and a source output signal 107_$n$ from N08_$n$ is a drain input signal to N12_$n$. A source output signal 117_$n$ from N12_$n$ is a source input signal to P10_$n$, and a drain output signal 121_$n$ from P10_$n$ is an input signal to B02_$n$.

Further, the ground GND is connected to a source of P01_$n$, and a drain output signal 120_$n$ from P01_$n$ is an input signal to B01_$n$. Further, the ground GND is connected to a source of P02_$n$, and a drain output signal 121_$n$ from P02_$n$ is an input signal to B02_$n$.

Description will now be given for an example of configuration of the short detection circuit shown in FIG. 5. The short detection circuit 22_$n$ shown in FIG. 5 includes the to-be-tested terminal 1_$n$, the MODE-2 terminal, and the input terminals 43_($n$−1), 44_($n$−1) and 45_($n$−1), as the input terminals, and includes the output terminals 43_$n$, 44_$n$ and 45_$n$ as the output terminals. An output signal from the output terminal 43_$n$ is the input signal 43_$n$ to the short detection circuit 22_($n$+1) in the following stage, and an output signal from the output terminal 44_$n$ is the input signal 44_$n$ to the short detection circuit 22_($n$+1) in the following stage. An output signal from the output terminal 45_$n$ is the input signal 45_$n$ to the short detection circuit 22_($n$+1) in the following stage.

The short detection circuit 22_$n$ is internally configured by including N channel transistors N17_$n$ to N21_$n$ (hereinafter called merely N17_$n$ to N21_$n$), P channel transistors P11_$n$ to P16_$n$ (hereinafter called merely P11_$n$ to P16_$n$), buffers B03_$n$ and B04_$n$ that suppress variations in voltage level, and OR circuits O01_$n$ and O02_$n$. The MODE-2 terminal is connected to gates of N17_$n$ to N19_$n$ and P11_$n$ to P14_$n$. The to-be-tested terminal 1_$n$ is inputted to gates of N20_$n$ and N21_$n$ and P15_$n$ and P16_$n$.

The input terminal 43_($n$−1) is connected to a drain of N18_$n$, and a source output signal 202_$n$ from N18_$n$ is a drain input signal to N21_$n$. A source output signal 212_$n$ from N21_$n$ is an input signal 1 to O01_$n$, and an output signal 222_$n$ from O01_$n$ is an input signal 1 to O02_$n$. Then, an output signal from O02_$n$ is outputted from the output terminal 45_$n$.

The input terminal 44_($n$−1) is connected to a drain of N19_$n$, and a source output signal 203_$n$ from N19_$n$ is a source input signal to P16_$n$. A drain output signal 213_$n$ from P16_$n$ is an input signal 2 to O01_$n$.

An input signal 204_$n$ from the input terminal 45_($n$−1) is the input signal 2 to O02_$n$. The power supply voltage VDD is connected to a drain of N17_$n$, and a source output signal 200_$n$ from N17_$n$ is a drain input signal to N20_$n$. A source output signal 210_$n$ from N20_$n$ is an input signal to B03_$n$, and an output signal from B03_$n$ is outputted from the output terminal 43_$n$. Further, the power supply voltage VDD is connected to a drain of N17_$n$, and a source output signal 200_$n$ from N17_$n$ is a source input signal to P15_$n$. A drain output signal 211_$n$ from P15_$n$ is an input signal to B04_$n$, and an output signal from B04_$n$ is outputted from the output terminal 44_$n$.

The ground GND is connected to a source of P11_$n$, and a drain output signal 205_$n$ from P11_$n$ is an input signal to B03_$n$. Further, the ground GND is connected to a source of P12_$n$, and a drain output signal 206_$n$ from P12_$n$ is an input signal to B04_$n$. Further, the ground GND is connected to a source of P13_$n$, and a drain output signal 207_$n$ from P13_$n$ is an input signal 1 to O01_$n$. Further, the ground GND is connected to a source of P14_$n$, and a drain output signal 208_$n$ from P14_$n$ is an input signal 2 to O01_$n$.

Using FIGS. 4 and 5, description will now be given for operation of the open detection circuit and the short detection circuit as used singly, and further, using FIG. 3, description will be given for the normal device operation, the open detection operation and the short detection operation of the continuity testing apparatus according to the exemplary embodiment.

During the normal operation (or under the condition number 1 in the truth table shown in FIG. 2), a "Lo (0)" level is inputted to the MODE-1 terminal and the MODE-2 terminal. At this time, N01_$n$ to N08_$n$ in FIG. 4 are turned off, while P01_$n$ to P02_$n$ are turned on, and thus, the outputs 41_$n$ and 42_$n$ from the open detection circuit 21_$n$ are fixed to a "Lo (0)" level thereby to disable the function of the open detection circuit 21_$n$.

N17_$n$ to N19_$n$ in FIG. 5 are turned off, while P11_$n$ to P14_$n$ are turned on, and thus, the outputs 43_$n$ to 45_$n$ from the short detection circuit 22_$n$ are fixed to a "Lo (0)" level thereby to disable the function of the short detection circuit 22_$n$.

During the open detection (or under the condition numbers 2 and 3 in the truth table shown in FIG. 2), a "Hi (1)" level is inputted to the MODE-1 terminal, while a "Lo (0)" level is inputted to the MODE-2 terminal, and thus, N01_$n$ to N08_$n$ in FIG. 4 are turned on, while P01_$n$ to P02_$n$ are turned off, thereby enabling the function of the open detection circuit 21_$n$. N17_$n$ to N19_$n$ in FIG. 5 are turned off, while P11_$n$ to P14_$n$ are turned on, and thus, the outputs 43_$n$ to 45_$n$ from the short detection circuit 22_$n$ are fixed to a "Lo (0)" level thereby to disable the function of the short detection circuit 22_$n$.

(1) Under the Condition Number 2 (or in a Case where the Condition of Terminal Connection is Normal)

Using FIG. 4, description will be given for operation of the open detection circuit under the condition number 2 (or in the case where the condition of terminal connection is normal). At this time, a "Lo (0)" level is inputted to the TDI terminal. A "Lo (0)" level is inputted to the to-be-tested terminal 1_$n$. A path from N06_$n$ through P05_$n$ and P09_$n$ to B01_$n$ and a path from N02_$n$ through P03_$n$ and P07_$n$ to B02_$n$ are enabled.

The voltage level of the input terminal 41_($n$−1) is outputted to the output terminal 41_$n$, and the voltage level of the input terminal 42_($n$−1) is outputted to the output terminal 42_$n$. The voltage levels of the power supply voltage VDD and the ground GND do not propagate under the above-mentioned input condition.

As can be seen from FIG. 3, if the to-be-tested terminals 1_1 to 1_$n$ are normal, the ground GND (a "Lo (0)" level) is connected to the input terminal 41_0 of the open detection circuit 21_1, while the power supply voltage VDD (a "Hi (1)" level) is connected to the input terminal 42_0, and thus, the output signal 41_1 from the open detection circuit 21_1 becomes a "Lo (0)" level, while the output signal 42_1 becomes a "Hi (1)" level. Then, the input signal 41_1 to the open detection circuit 21_2 becomes a "Lo (0)" level, while the input signal 42_1 becomes a "Hi (1)" level, and thus, the output signal 41_2 from the open detection circuit 21_2 becomes a "Lo (0)" level, while the output signal 42_2 becomes a "Hi (1)" level.

Likewise, the input signal 41_($n$−1) to the open detection circuit 21_$n$ becomes a "Lo (0)" level, while the input signal 42_($n$−1) becomes a "Hi (1)" level, and thus, the output signal 41_$n$ from the open detection circuit 21_$n$ becomes a "Lo (0)" level, while the output signal 42_$n$ becomes a "Hi (1)" level. The output signal 41_$n$, a "Lo (0)" level signal, propagates through the N channel transistor 31 and is inverted by the inverter 33, and a "Hi (1)" level is outputted from the TDO terminal. The output signal 42_$n$, a "Hi (1)" level signal, propagates through the N channel transistor 32, and a "Hi (1)" level being the same level as the signal inverted by the inverter 33 is outputted from the TDO terminal. Thereby, a determination is made that an open-circuit failure fixed to a "Hi (1)" level does not occur in the to-be-tested terminals 1_1 to 1_$n$.

(2) Under the Condition Number 2 (or in a Case where an Open-Circuit Failure Fixed to a "Hi (1)" Level Occurs in the to-be-tested Terminal 1_$n$)

Using FIG. 4, description will now be given for operation of the open detection circuit under the condition number 2 (or in the case where an open-circuit failure fixed to a "Hi (1)" level occurs in the to-be-tested terminal 1_$n$). At this time, a "Lo (0)" level is inputted to the TDI terminal. The to-be-tested terminal 1_$n$ is fixed to a "Hi (1)" level. A path from N03_$n$ through P04_$n$ and N14_$n$ to B02_$n$ and a path from N07_$n$ through P06_$n$ and N16_$n$ to B01_$n$ are enabled. The voltage levels of the input terminal 41_($n$−1) and the input terminal 42_($n$−1) do not propagate. The voltage level of the power supply voltage VDD is outputted to the output terminal 41_$n$, and the voltage level of the ground GND is outputted to the output terminal 42_$n$.

As can be seen from FIG. 3, the ground GND (a "Lo (0)" level) is connected to the input terminal 41_0 of the open detection circuit 21_1, while the power supply voltage VDD (a "Hi (1)" level) is connected to the input terminal 42_0. Since the to-be-tested terminal 1_1 is normal, the output signal 41_1 from the open detection circuit 21_1 becomes a "Lo (0)" level, while the output signal 42_1 becomes a "Hi (1)" level.

In the open detection circuit 21_2 connected to the terminal 1_2 in which an open-circuit failure fixed to a "Hi (1)" level occurs, a path from N03_2 through P04_2 and N14_2 to B02_2 and a path from N07_2 through P06_2 and N16_2 to B01_2 are enabled as mentioned above (in this case, n denotes 2). At this time, the voltage level (a "Hi (1)" level signal) of the power supply voltage VDD is outputted to the output terminal 41_2, and the voltage level (a "Lo (0)" level) of the ground GND is outputted to the output terminal 42_2. Incidentally, in this case, the voltage levels of the input terminal 41_1 and the input terminal 42_1 do not propagate.

Since the to-be-tested terminal 1_3 and the following terminals are normal, the output signal 41_2, a "Hi (1)" level signal, and the output signal 42_2, a "Lo (0)" level signal, propagate to the output signals 41_3 to 41_$n$ and the output signals 42_3 to 42_$n$, respectively. Thus, the output signals 41_3 to 41_$n$ become a "Hi (1)" level, while the output signals 42_3 to 42_$n$ become a "Lo (0)" level.

The output signal 41_$n$, a "Hi (1)" level signal, propagates through the N channel transistor 31 and is inverted by the inverter 33, and a "Lo (0)" level is outputted from the TDO terminal. The output signal 42_$n$, a "Lo (0)" level signal, propagates through the N channel transistor 32, and a "Lo (0)" level being the same level as the signal inverted by the inverter 33 is outputted from the TDO terminal. Thereby, a determination is made that an open-circuit failure fixed to a "Hi (1)" level occurs in the to-be-tested terminals 1_1 to 1_$n$.

(3) Under the Condition Number 3 (or in a Case where the Condition of Terminal Connection is Normal)

Using FIG. 4, description will now be given for operation of the open detection circuit under the condition number 3 (or in the case where the condition of terminal connection is normal). At this time, a "Hi (1)" level is inputted to the TDI terminal. A "Hi (1)" level is inputted to the to-be-tested terminal 1_$n$. A path from N01_$n$ through N09_$n$ and N13_$n$ to B01_$n$ and a path from N05_$n$ through N11_$n$ and N15_$n$ to B02_$n$ are enabled.

The voltage level of the input terminal 41_($n$−1) is outputted to the output terminal 41_$n$, and the voltage level of the input terminal 42_($n$−1) is outputted to the output terminal 42_$n$. The voltage levels of the power supply voltage VDD and the ground GND do not propagate under the above-mentioned input condition.

As can be seen from FIG. 3, if the to-be-tested terminals 1_1 to 1_$n$ are normal, then, the ground GND (a "Lo (0)" level) is connected to the input terminal 41_0 of the open detection circuit 21_1, while the power supply voltage VDD (a "Hi (1)" level) is connected to the input terminal 42_0, and thus, the output signal 41_1 from the open detection circuit 21_1 becomes a "Lo (0)" level, while the output signal 42_1 becomes a "Hi (1)" level. Then, the input signal 41_1 to the open detection circuit 21_2 becomes a "Lo (0)" level, while the input signal 42_1 becomes a "Hi (1)" level, and thus, the output signal 41_2 from the open detection circuit 21_2 becomes a "Lo (0)" level, while the output signal 42_2 becomes a "Hi (1)" level.

Likewise, the input signal 41_($n$−1) to the open detection circuit 21_$n$ becomes a "Lo (0)" level, while the input signal 42_($n$−1) becomes a "Hi (1)" level, and thus, the output signal 41_*n* from the open detection circuit 21_*n* becomes a "Lo (0)" level, while the output signal 42_*n* becomes a "Hi (1)" level. The output signal 41_*n*, a "Lo (0)" level signal, propagates through the N channel transistor 31 and is inverted by the inverter 33, and a "Hi (1)" level is outputted from the TDO terminal. The output signal 42_*n*, a "Hi (1)" level signal, propagates through the N channel transistor 32, and a "Hi (1)" level being the same level as the signal inverted by the inverter 33 is outputted from the TDO terminal. Thereby, a determination is made that an open-circuit failure fixed to a "Lo (1)" level does not occur in the to-be-tested terminals 1_1 to 1_*n*.

(4) Under the Condition Number 3 (or in a Case where an Open-Circuit Failure Fixed to a "Lo (0)" Level Occurs in the to-be-tested Terminal 1_*n*)

Using FIG. 4, description will now be given for operation of the open detection circuit under the condition number 3 (or in the case where an open-circuit failure fixed to a "Lo (0)" level occurs in the to-be-tested terminal 1_*n*). At this time, a "Hi (1)" level is inputted to the TDI terminal. The to-be-tested terminal 1_*n* is fixed to a "Lo (0)" level. A path from N04_*n* through N10_*n* and P08_*n* to B01_*n* and a path from N08_*n* through N12_*n* and P10_*n* to B02_*n* are enabled. The voltage levels of the input terminal 41_(*n*−1) and the input terminal 42_(*n*−1) do not propagate. The voltage level of the power supply voltage VDD is outputted to the output terminal 41_*n*, and the voltage level of the ground GND is outputted to the output terminal 42_*n*.

As can be seen from FIG. 3, the ground GND (a "Lo (0)" level) is connected to the input terminal 41_0 of the open detection circuit 21_1, while the power supply voltage VDD (a "Hi (1)" level) is connected to the input terminal 42_0. Since the to-be-tested terminal 1_1 is normal, the output signal 41_1 from the open detection circuit 21_1 becomes a "Lo (0)" level, while the output signal 42_1 becomes a "Hi (1)" level.

In the open detection circuit 21_2 connected to the terminal 1_2 in which an open-circuit failure fixed to a "Lo (0)" level occurs, a path from N04_2 through N10_2 and P08_2 to B01_2 and a path from N08_2 through N12_2 and P10_2 to B02_2 are enabled as mentioned above (in this case, n denotes 2). At this time, the voltage level (a "Hi (1)" level signal) of the power supply voltage VDD is outputted to the output terminal 41_2, and the voltage level (a "Lo (0)" level signal) of the ground GND is outputted to the output terminal 42_2. Incidentally, in this case, the voltage levels of the input terminal 41_1 and the input terminal 42_1 do not propagate to the output terminals 41_2 and 42_2.

Since the to-be-tested terminal 1_3 and the following terminals are normal, the output signal 41_2, a "Hi (1)" level signal, and the output signal 42_2, a "Lo (0)" level signal, propagate to the output signals 41_3 to 41_*n* and the output signals 42_3 to 42_*n*, respectively. Thus, the output signals 41_3 to 41_*n* become a "Hi (1)" level, while the output signals 42_3 to 42_*n* become a "Lo (0)" level.

The output signal 41_*n*, a "Hi (1)" level signal, propagates through the N channel transistor 31 and is inverted by the inverter 33, and a "Lo (0)" level is outputted from the TDO terminal. The output signal 42_*n*, a "Lo (0)" level signal, propagates through the N channel transistor 32, and a "Lo (0)" level being the same level as the signal inverted by the inverter 33 is outputted from the TDO terminal. Thereby, a determination is made that an open-circuit failure fixed to a "Lo (0)" level occurs in the to-be-tested terminals 1_1 to 1_*n*.

Description will now be given for the short detection. During the short detection (or under the condition numbers 4 and 5), a "Lo (0)" level is inputted to the MODE-1 terminal, while a "Hi (1)" level is inputted to the MODE-2 terminal, and thus, N01_*n* to N08_*n* in FIG. 4 are turned off, while P01_*n* to P02_*n* are turned on, and thus, the outputs 41_*n* and 42_*n* from the open detection circuit 21_*n* are fixed to a "Lo (0)" level thereby to disable the function of the open detection circuit 21_*n*. N17_*n* to N19_*n* in FIG. 5 are turned on, while P11_*n* to P14_*n* are turned off, thereby enabling the function of the short detection circuit 22_*n*.

(5) Under the Condition Number 4 (or in a Case where the Condition of Terminal Connection is Normal)

Using FIG. 5, description will be given for operation of the open detection circuit under the condition number 4 (or in the case where the condition of terminal connection is normal). Description will be given by way of example for an instance where the to-be-tested terminal 1_*n* is an odd-numbered terminal.

At this time, a "Lo (0)" level is inputted to the to-be-tested terminal 1_*n*. A path from N17_*n* through P15_*n* to B04_*n* and a path from N19_*n* through P16_*n* and O01_*n* to O02_*n* are enabled. The voltage level of the input terminal 43_(*n*−1) does not propagate under the above-mentioned input condition. O01_*n* carries out the logical OR between the voltage level of the input terminal 43_(*n*−1) and the voltage level (a "Lo (0)" level (or an initial condition)) of the input terminal 44_(*n*−1), and outputs the logical OR to O02_*n*. O02_*n* carries out the logical OR between the output from O01_*n* and the voltage level of the input terminal 45_(*n*−1), and outputs the ORed result to the output terminal 45_*n*. The voltage level of the power supply voltage VDD is outputted to the output terminal 44_*n*. The voltage level of the ground GND does not propagate under the above-mentioned input condition.

As can be seen from FIG. 3, if the to-be-tested terminals 1_1 to 1_*n* are normal, then, a "Lo (0)" level is inputted to the odd-numbered to-be-tested terminals, while a "Hi (1)" level is inputted to the even-numbered to-be-tested terminals, and thus, the signal does not propagate to the output signals 43_1 to 43_*n* and 44_1 to 44_*n*. The ground GND (a "Lo (0)" level) is connected to the input terminals 44_0 and 45_0 of the short detection circuit 22_1, and thus, the output signals 45_1 to 45_*n* become a "Lo (0)" level. The output signal 45_*n* of a "Lo (0)" level propagates through the N channel transistor 34 and is inverted by the inverter 35, and a "Hi (1)" level is outputted from the TDO terminal. Thereby, a determination is made that a short-circuit failure between adjacent terminals does not occur between the to-be-tested terminals 1_1 to 1_*n*.

(6) Under the Condition Number 4 (or in a Case where a Short-circuit Failure Between Adjacent Terminals Occurs between the to-be-tested Terminals 1_*n* and 1_(*n*+1))

Using FIG. 5, description will be given for operation of the open detection circuit under the condition number 4 (or in the case where a short-circuit failure between adjacent terminals occurs between the to-be-tested terminals 1_*n* and 1_(*n*+1)). Description will be given by way of example for an instance where the to-be-tested terminal 1_*n* is an odd-numbered terminal and an input voltage across the to-be-tested terminals 1_*n* and 1_(*n*+1) becomes an intermediate level (or VDD/2) due to the short-circuit failure between adjacent terminals.

At this time, the to-be-tested terminal 1_*n* becomes the intermediate level (or VDD/2) due to the short-circuit failure. The input of the intermediate level (or VDD/2) to the to-be-tested terminal 1_*n* enables a path from N17_*n* through N20_*n* to B03_*n*, a path from N17_*n* through P15_*n* to B04_*n*, a path from N18_*n* through N21_*n* and O01_*n* to O02_*n*, and a path from N19_*n* through P16_*n* and O01_*n* to O02_*n*.

O01_$n$ carries out the logical OR between the voltage levels of the input terminals 43_($n$−1) and 44_($n$−1). O02_$n$ carries out the logical OR between the ORed result from O01_$n$ and the voltage level of the input terminal 45_($n$−1), and outputs the ORed result to the output terminal 45_$n$. The voltage level of the power supply voltage VDD is outputted to the output terminals 43_$n$ and 44_$n$. The voltage level of the ground GND does not propagate under the above-mentioned input condition.

As can be seen from FIG. 3, if a short-circuit failure occurs between the to-be-tested terminals 1_1 and 1_2, then, the output signals 43_1 and 43_2 and the output signals 44_1 and 44_2 become a "Hi (1)" level. The output signal 45_2 from the OR circuit O02_2 of the short detection circuit 22_2 becomes a "Hi (1)" level, which in turn is an input signal to the short detection circuit 22_3. Then, the output signals 45_3 to 45_$n$ from the short detection circuits 22_3 to 22_$n$ in the third stage and thereafter are ORed by O02_$n$, and thus, all the output signals become a "Hi (1)" level. Then, the output signal propagates through the N channel transistor 34 and is inverted by the inverter 35, and a "Lo (0)" level is outputted from the TDO terminal. Thereby, a determination can be made that a short-circuit failure between adjacent terminals occurs between the to-be-tested terminals 1_1 to 1_$n$.

(7) Under the Condition Number 5 (or in a Case where the Condition of Terminal Connection is Normal)

Using FIG. 5, description will be given for operation of the open detection circuit under the condition number 5 (or in the case where the condition of terminal connection is normal). Description will be given by way of example for an instance where the to-be-tested terminal 1_$n$ is an odd-numbered terminal.

At this time, a "Hi (1)" level is inputted to the to-be-tested terminal 1_$n$. A path from N17_$n$ through N20_$n$ to B03_$n$ and a path from N18_$n$ through N21_$n$ and O01_$n$ to O02_$n$ are enabled. The voltage level of the input terminal 44_($n$−1) does not propagate under the above-mentioned input condition. O01_$n$ carries out the logical OR between the voltage level of the input terminal 43_($n$−1) and a "Lo (0)" level (or an initial condition). O02_$n$ carries out the logical OR between the ORed result from O01_$n$ and the voltage level of the input terminal 45_($n$−1), and outputs the ORed result to the output terminal 45_$n$. The voltage level of the power supply voltage VDD is outputted to the output terminal 43_$n$. The voltage level of the ground GND does not propagate under the above-mentioned input condition.

As can be seen from FIG. 3, if the to-be-tested terminals 1_1 to 1_$n$ are normal, then, a "Hi (1)" level is inputted to the odd-numbered to-be-tested terminals, while a "Lo (0)" level is inputted to the even-numbered to-be-tested terminals, and thus, the signal does not propagate to the output terminals 43_1 to 43_$n$ and the output terminals 44_1 to 44_$n$. The ground GND (a "Lo (0)" level) is connected to the input terminals 44_0 and 45_0 of the short detection circuit 22_1, and thus, the output signals 45_1 to 45_$n$ become a "Lo (0)" level. The output signal 45_$n$ of a "Lo (0)" level propagates through the N channel transistor 34 and is inverted by the inverter 35, and a "Hi (1)" level is outputted from the TDO terminal. Thereby, a determination is made that a short-circuit failure between adjacent terminals does not occur between the to-be-tested terminals 1_1 to 1_$n$.

(8) Under the Condition Number 5 (or in a Case where a Short-circuit Failure Between Adjacent Terminals Occurs Between the to-be-tested Terminals 1_$n$ and 1_($n$+1))

Using FIG. 5, description will be given for operation of the open detection circuit under the condition number 5 (or in the case where a short-circuit failure between adjacent terminals occurs between the to-be-tested terminals 1_$n$ and 1_($n$+1)). Description will be given by way of example for an instance where the to-be-tested terminal 1_$n$ is an odd-numbered terminal and an input voltage across the to-be-tested terminals 1_$n$ and 1_($n$+1) becomes an intermediate level (or VDD/2) due to the short-circuit failure between adjacent terminals.

At this time, the to-be-tested terminal 1_$n$ becomes the intermediate level (or VDD/2) due to the short-circuit failure. The input of the intermediate level (or VDD/2) to the to-be-tested terminal 1_$n$ enables the path from N17_$n$ through N20_$n$ to B03_$n$, the path from N17_$n$ through P15_$n$ to B04_$n$, the path from N18_$n$ through N21_$n$ and O01_$n$ to O02_$n$, and the path from N19_$n$ through P16_$n$ and O01_$n$ to O02_$n$.

O01_$n$ carries out the logical OR between the voltage levels of the input terminals 43_($n$−1) and 44_($n$−1). O02_$n$ carries out the logical OR between the ORed result from O01_$n$ and the voltage level of the input terminal 45_($n$−1), and outputs the ORed result to the output terminal 45_$n$. The voltage level of the power supply voltage VDD is outputted to the output terminals 43_$n$ and 44_$n$. The voltage level of the ground GND does not propagate under the above-mentioned input condition.

As can be seen from FIG. 3, if a short-circuit failure occurs between the to-be-tested terminals 1_1 and 1_2, then the output signals 43_1 and 43_2 and the output signals 44_1 and 44_2 become a "Hi (1)" level. Thus, the output signal 45_2 from the OR circuit O02_2 of the short detection circuit 22_2 becomes a "Hi (1)" level. Then, the output signal 45_2 of a "Hi (1)" level is the input signal to the short detection circuit 22_3. Then, the output signals 45_3 to 45_$n$ from the short detection circuits 22_3 to 22_$n$ in the third stage and thereafter are ORed by O02_$n$, and thus, all the output signals become a "Hi (1)" level. Then, the output signal 45_$n$ of a "Hi (1)" level propagates through the N channel transistor 34 and is inverted by the inverter 35, and a "Lo (0)" level is outputted from the TDO terminal. Thereby, a determination can be made that a short-circuit failure between adjacent terminals occurs between the to-be-tested terminals 1_1 to 1_$n$.

The continuity testing apparatus according to the exemplary embodiment enables detection of an open circuit fixed to a "Hi (1)" level under the condition number 2 in the truth table shown in FIG. 2, and detection of a short circuit between adjacent terminals under the condition numbers 4 and 5.

In other words, the continuity testing apparatus according to the exemplary embodiment includes the plural open/short detection circuits provided for the to-be-tested terminals, respectively, thus enabling detection of the presence or absence of an open circuit or a short circuit for each of the to-be-tested terminals. This enables detection of a short-circuit failure between adjacent terminals and an open-circuit failure fixed to a Hi level in an even-numbered terminal.

Further, the continuity testing apparatus according to the exemplary embodiment can use actual products (i.e., a mounting substrate and a semiconductor device) to be introduced to the market to carry out a mounting evaluation, thus improving the accuracy of failure prediction in the market. Further, the continuity testing apparatus eliminates the need to prepare a substrate dedicated to mounting evaluation, and further, enables a reduction in an evaluation environment (i.e., a test vector (or pattern) generator circuit and a test vector (or pattern) input/output terminal monitor) required for the use of a NAND gate tree structure, and a reduction in the number of input patterns, thus achieving cost reduction.

Description will now be given for a continuity testing method according to the exemplary embodiment for testing the condition of continuity between a semiconductor device and a mounting substrate on which the semiconductor device is mounted. The continuity testing method according to the exemplary embodiment also uses an open/short detection circuit that determines the presence or absence of at least any one of an open-circuit failure and a short-circuit failure in a to-be-tested terminal, the open/short detection circuit being provided for each to-be-tested terminal. Then, the continuity testing method according to the exemplary embodiment includes the steps of: generating a detected result of the open/short detection circuit, based on the condition of continuity of the to-be-tested terminal connected to the open/short detection circuit and the detected result from the open/short detection circuit in the preceding stage, and outputting the generated detected result to the open/short detection circuit in the succeeding stage; and determining the condition of continuity based on an output from the open/short detection circuit in the last stage.

The continuity testing method according to the exemplary embodiment also detects the presence or absence of an open circuit or a short circuit for each of the to-be-tested terminals, thus enabling detection of a short-circuit failure between adjacent terminals and an open-circuit failure fixed to a Hi level in an even-numbered terminal.

In the continuity testing method according to the exemplary embodiment, if any one of the open-circuit failure and the short-circuit failure occurs in the condition of continuity of the to-be-tested terminal connected to the open/short detection circuit, then the open/short detection circuit may output the detected result of the condition of continuity to the open/short detection circuit in the succeeding stage.

In the continuity testing method according to the exemplary embodiment, if the condition of continuity of the to-be-tested terminal connected to the open/short detection circuit is normal, then the open/short detection circuit may output the output result from the open/short detection circuit in the preceding stage to the open/short detection circuit in the succeeding stage.

While the present invention has been described with reference to the above exemplary embodiment, it is to be understood that the invention is not limited to the configuration of the above exemplary embodiment and that the invention includes all such changes, modifications and combinations as could be made by those skilled in the art within the scope of the invention as defined in the appended claims.

Further, it is noted that Applicant's intent is to encompass equivalents of all claim elements, even if amended later during prosecution.

What is claimed is:

1. A continuity testing apparatus for testing a condition of continuity between a semiconductor device and a mounting substrate on which the semiconductor device is mounted, or between terminals of the semiconductor device, the apparatus comprising:
an open/short detection circuit provided for each of a plurality of to-be-tested terminals of the semiconductor device that determines presence or absence of at least any one of an open-circuit failure and a short-circuit failure in the to-be-tested terminal,
wherein a detected result of the open/short detection circuit is generated based on a condition of continuity of the to-be-tested terminal connected to the open/short detection circuit and a detected result from an open/short detection circuit in a preceding stage, and the generated detected result is outputted to an open/short detection circuit in a succeeding stage, and the condition of continuity is determined based on an output from an open/short detection circuit in a last stage.

2. The continuity testing apparatus according to claim 1, wherein:
three consecutive open/short detection circuits of the open/short detection circuits are denoted by a first open/short detection circuit, a second open/short detection circuit, and a third open/short detection circuit, respectively, and
a detected result of the second open/short detection circuit is generated based on the condition of continuity of the to-be-tested terminal connected to the second open/short detection circuit and a detected result from the first open/short detection circuit, and a detected result of the second open/short detection circuit is outputted to the third open/short detection circuit, and the condition of continuity is determined based on an output from the open/short detection circuit in the last stage.

3. The continuity testing apparatus according to claim 1, wherein:
if the condition of continuity of the to-be-tested terminal connected to the open/short detection circuit comprises any one of the open-circuit failure and the short-circuit failure, then the open/short detection circuit outputs the detected result to the open/short detection circuit in the succeeding stage.

4. The continuity testing apparatus according to claim 1, wherein:
if the condition of continuity of the to-be-tested terminal connected to the open/short detection circuit is normal, then the open/short detection circuit outputs an output result of the open/short detection circuit in the preceding stage to the open/short detection circuit in the succeeding stage.

5. The continuity testing apparatus according to claim 1, wherein the open/short detection circuits are connected in a daisy chain.

6. The continuity testing apparatus according to claim 1, wherein the open/short detection circuits each include first and second mode terminals that switch from one to another of a normal operation mode, a detection mode for an open-circuit failure, and a detection mode for a short-circuit failure.

7. The continuity testing apparatus according to claim 6, wherein the open/short detection circuits each include a TDI terminal to which a signal at a same level as the to-be-tested terminal is inputted for detection of an open-circuit failure.

8. The continuity testing apparatus according to claim 7, wherein:
when the first mode terminal is set to a Hi level while the second mode terminal is set to a Lo level, the open/short detection circuit enters a detection mode for an open-circuit failure, and
when all of the to-be-tested terminals are set to a Lo level and the TDI terminal is set to a Lo level, the open/short detection circuit determines a condition of continuity as normal if the output from the open/short detection circuit in the last stage is a Hi level, or determines the presence of an open-circuit failure fixed to a Hi level if the output is a Lo level.

9. The continuity testing apparatus according to claim 7, wherein:
when the first mode terminal is set to a Hi level while the second mode terminal is set to a Lo level, the open/short detection circuit enters a detection mode for an open-circuit failure, and
when all of the to-be-tested terminals are set to a Hi level and the TDI terminal is set to a Hi level, the open/short detection circuit determines a condition of continuity as normal if the output from the open/short detection circuit in the last stage is a Hi level, or determines the presence of an open-circuit failure fixed to a Lo level, if the output is a Lo level.

10. The continuity testing apparatus according to claim 7, wherein:
when the first mode terminal is set to a Lo level while the second mode terminal is set to a Hi level, the open/short detection circuit enters a detection mode for a short-circuit failure, and
when, out of the to-be-tested terminals, odd-numbered terminals are set to a Lo level while even-numbered terminals are set to a Hi level, the open/short detection circuit determines a condition of continuity as normal if the output from the open/short detection circuit in the last stage is a Hi level, or determines the presence of a short-circuit failure if the output is a Lo level.

11. The continuity testing apparatus according to claim 7, wherein:
when the first mode terminal is set to a Lo level while the second mode terminal is set to a Hi level, the open/short detection circuit enters a detection mode for a short-circuit failure, and
when, out of the to-be-tested terminals, odd-numbered terminals are set to a Hi level while even-numbered terminals are set to a Lo level, the open/short detection circuit determines a condition of continuity as normal if the output from the open/short detection circuit in the last stage is a Hi level, or determines the presence of a short-circuit failure if the output is a Lo level.

12. A continuity testing method for testing a condition of continuity between a semiconductor device and a mounting substrate on which the semiconductor device is mounted, the method using an open/short detection circuit provided for each of to-be-tested terminals and configured to determine presence or absence of at least any one of an open-circuit failure and a short-circuit failure in the to-be-tested terminal of the semiconductor device, the method comprising:
generating a detected result of the open/short detection circuit based on a condition of continuity of the to-be-tested terminal of the semiconductor device connected to the open/short detection circuit and a detected result from an open/short detection circuit in a preceding stage, and
outputting the generated detected result to an open/short detection circuit in a succeeding stage; and
determining the condition of continuity based on an output from an open/short detection circuit in a last stage.

13. The continuity testing method according to claim 12, wherein:
if the condition of continuity of the to-be-tested terminal connected to the open/short detection circuit comprises any one of an open-circuit failure and a short-circuit failure, a detected result of the condition of continuity is outputted to the open/short detection circuit in the succeeding stage.

14. The continuity testing method according to claim 12, wherein:
if the condition of continuity of the to-be-tested terminal connected to the open/short detection circuit is normal, an output result of the open/short detection circuit in the preceding stage is outputted to the open/short detection circuit in the succeeding stage.

15. A continuity testing apparatus for testing a condition of continuity between a semiconductor device and a mounting substrate on which the semiconductor device is mounted, or between terminals of the semiconductor device, comprising:
a first terminal which transfers a first data to an internal circuit;
a second terminal which transfers a second data to the internal circuit;
a data-in terminal which receives a data-in signal;
a first open detection circuit which is responsive to a first mode signal, the data-in signal, the first data, a first power source potential and a second power source potential, to output first and second control signals;
a second open detection circuit which is responsive to the first mode signal, the data-in signal, the second data, a third control signal corresponding to the first control signal, and a fourth control signal corresponding to the second control signal;
a first gate which is responsive to the first mode signal to transfer the third control signal;
a second gate which is responsive to the first mode signal to transfer the fourth control signal;
a first inverter which receives the third control signal output from the first gate to produce an inverted third control signal;
a first short detection circuit which is responsive to a second mode signal, the first data, and the first and second power source potentials, to output fifth to seventh control signals;
a second short detection circuit which is responsive to the second mode signal, the second data, and eighth to tenth control signals corresponding to the fifth to seventh control signals, respectively, to output an eleventh control signal;
a third gate which is responsive to the second mode signal to transfer the eleventh control signal;
a second inverter which receives the eleventh control signal output from the third gate to produce an inverted eleventh control signal; and
a data-out terminal which receives the inverted third control signal, the fourth control signal and the inverted eleventh control signal.

* * * * *